US008558612B2

(12) United States Patent
Peschke et al.

(10) Patent No.: US 8,558,612 B2
(45) Date of Patent: Oct. 15, 2013

(54) ELECTRONIC DEVICE AND METHOD FOR AN AMPLIFIER WITH RESISTIVE FEEDBACK

(75) Inventors: Carlo Peschke, Freising (DE); Ernst Muellner, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 30 days.

(21) Appl. No.: 13/410,087

(22) Filed: Mar. 1, 2012

(65) Prior Publication Data

US 2013/0009706 A1    Jan. 10, 2013

(30) Foreign Application Priority Data

Mar. 4, 2011    (DE) .......................... 10 2011 013 107

(51) Int. Cl.
*H03F 1/36* (2006.01)

(52) U.S. Cl.
USPC ............................................. 330/86; 330/85

(58) Field of Classification Search
USPC ....................... 330/85, 86, 285, 296
See application file for complete search history.

(56) References Cited

U.S. PATENT DOCUMENTS

| | | | | |
|---|---|---|---|---|
| 3,723,894 | A * | 3/1973 | Benenati | 330/282 |
| 7,388,428 | B2 * | 6/2008 | Wiegner et al. | 330/86 |
| 7,394,317 | B2 * | 7/2008 | Yamamoto | 330/285 |
| 7,633,337 | B2 * | 12/2009 | Nam et al. | 330/86 |

OTHER PUBLICATIONS

"High-Performance Crystal Oscillator Circuits: Theory and Application," IEEE Journal of Solid-State Circuits, vol. 23, No. 3, Jun. 1988, pp. 774-783 (Vittoz, et al.).

* cited by examiner

*Primary Examiner* — Henry Choe
(74) *Attorney, Agent, or Firm* — William B. Kempler; W. James Brady, III; Frederick J. Telecky, Jr.

(57) ABSTRACT

An electronic device comprising an amplifier having at least a first input transistor of a first doping type. A first transistor is coupled with a channel as a feedback path between an output of the amplifier and a control gate of the first input transistor forming an input of the amplifier. A diode-coupled second transistor is coupled with a channel between a first current source and the output of the amplifier wherein a control gate of the first transistor is coupled between the first current source and the diode-coupled second transistor and the first transistor is of a second doping type which is opposite to the first doping type of the first input transistor of the amplifier.

20 Claims, 5 Drawing Sheets

ELECTRONIC DEVICE AND METHOD FOR AN AMPLIFIER WITH RESISTIVE FEEDBACK

CROSS-REFERENCE TO RELATED APPLICATIONS

This patent application claims priority from German Patent Application No. 10 2011 013 107.8, filed Mar. 4, 2011, which is incorporated herein by reference in its entirety.

FIELD OF THE INVENTION

The invention relates to an electronic device with a resistive feedback and a method.

BACKGROUND OF THE INVENTION

There are numerous different applications where capacitively fed back amplifiers are required. This type of amplifier usually includes a capacitor coupled between an inverting input and the output of an operation or amplifier. Such an amplifier with a capacitive feedback requires a resistive path between the inverting input and the output of the operational amplifier in order to properly define a DC bias point of the input of the operational amplifier.

FIG. 1 shows a simplified circuit diagram of a capacitively fed back noninverting amplifier according to the prior art. There is an operational amplifier OP1 having a capacitor C2 between the inverting input and the output. There is a further capacitor C1 coupled between the inverting input and ground and a resistor R coupled in parallel to the capacitor C2 between the output and the inverting input. Accordingly, the DC operating point of the noninverting amplifier is established by resistor R. However, in integrated semiconductor circuits, the use of a resistor is not desirable in some cases due to the comparatively large area needed in order to implement the resistor and because of related parasitic capacitances.

Vittoz et al. discloses in "High Performance Crystal Oscillator Circuits", IEEE, Journal of Solid State Circuits, page 781, FIG. 11 a capacitively fed back noninverting amplifier. However, this configuration has the disadvantage of this solution in that it requires a supply voltage of at least two threshold voltages of MOSFET transistors.

SUMMARY OF THE INVENTION

It is a general object of the invention to provide an electronic device that is able to preserve the DC operating point for a wide range of input voltage levels and a method.

In an aspect of the invention, an electronic device is provided that comprises an amplifier having at least a first input transistor of a first doping type. There is further a first transistor coupled with a channel as a feedback between an output of the amplifier and a control gate of the first input transistor. The control gate of the first input transistor forms an input of the amplifier. There is further a diode-coupled second transistor. The diode coupled second transistor is coupled with a channel between a first current source and the output of the amplifier. The control gate of the first transistor, configured as feedback transistor, is coupled between the first current source and the diode-coupled second transistor. The first transistor is of a second doping type. The second doping type is opposite to the first doping type of the (first) input transistor of the amplifier.

The first input transistor may be referred to as the amplifying transistor of the amplifier which receives at a control gate the input signal to be amplified and basically defines by its transconductance or slope (gm) the amplification factor of the amplifier. The amplifier may comprise only the first input transistor, i.e. it may be a single transistor amplifier, like a common source stage or the like.

In another aspect of the invention, a second current source may be coupled to the side of the diode coupled second transistor at which it is coupled to the output of the amplifier. This can reduce the effects due to a current fed into the output of the amplifier. Some or all of the current from the first current source may then be drawn by the second current source.

These aspects of the invention may allow the supply voltage range of the amplifier to be very small and have the amplifier with the first transistor in the feedback path still work properly. The supply voltage may be as small as the sum of the threshold voltage of the first input transistor (amplifying transistor) plus the minimum voltage for the current source.

The diode-coupled second transistor is of the same doping type as the first transistor (i.e. of the second doping type).

In other words, if the first input transistor (or amplifying transistor) is a PMOS transistor, the first transistor is an NMOS transistor and vice versa. The diode-coupled second transistor may then be of the same type as the first transistor.

In another aspect of the invention, the amplifier may have a differential stage comprising the first input transistor. The first input transistor may then provide an inverting input (i.e. the control gate of the first input transistor is the inverting input of the amplifier). The differential stage also comprises a second input transistor of the first doping type and provides a noninverting input at its control gate. The amplifier may be an operational amplifier.

In an embodiment of the invention, a first capacitor may be coupled in parallel to the channel of the first transistor between the control gate of the first input transistor and the output of the amplifier. A second capacitor may be coupled with one side to the control gate of the first input transistor.

The electronic device according to the aspects of the invention may be particularly useful for capacitively coupled amplifiers, where the first transistor in the feedback path provides a defined resistive path.

In another aspect of the invention, the electronic device may comprise an operational amplifier. The operational amplifier is connected to a capacitor coupled as a feedback between the output of the operational amplifier and an inverting input of the operational amplifier. There is a first transistor being coupled with a channel in parallel to the capacitor. A gate of the first transistor may then be biased with a diode-coupled second transistor. The second transistor is coupled with a channel between a first current source and an output of the operational amplifier. A second current source may optionally be coupled to the diode-coupled second current source and the output of the operational amplifier. Accordingly, the bias voltage for the first transistor is generated by a diode-coupled transistor. This second transistor and the current sources then define the bias voltage with reference to the output voltage of the operational amplifier. Therefore, the drain-source resistance of the first transistor is independent of the output voltage of the amplifier. A bias current is fed through the diode-coupled second transistor and sunk into a supply voltage rail (e.g. ground) from the output of the diode-coupled second transistor. This configuration may prevent any static offset and may be particularly useful for amplifiers having differential input stages.

According to another aspect of the invention, the first transistor may then be coupled with a first side of a channel to an inverting input of the operational amplifier and with a second side of the channel to an output of the operational amplifier. A gate of the first transistor may be coupled to a node coupling the first current source, a first side of a channel of the second transistor and a gate of the second transistor. A second side of the channel of the second transistor may then be coupled to the second side of the channel of the first transistor and the output of the operational amplifier and to the second current source.

The invention also provides a method of biasing an amplifier having at least a first input transistor of a first doping type and a first transistor of a second doping type opposite to the first doping type which is coupled in the feedback path of the amplifier. Accordingly, a control gate of the first transistor in the feedback path is biased with a diode-coupled transistor that is coupled at one side to a first current source and at the other side to an output of the amplifier and/or to a second current source.

The amplifier may comprise a capacitor in the feedback path.

BRIEF DESCRIPTION OF DRAWINGS

Further aspects of the invention will appear from the appending claims and from the following detailed description given with reference to the appending drawings:

DETAILED DESCRIPTION OF EXAMPLE EMBODIMENTS

Figure 1:
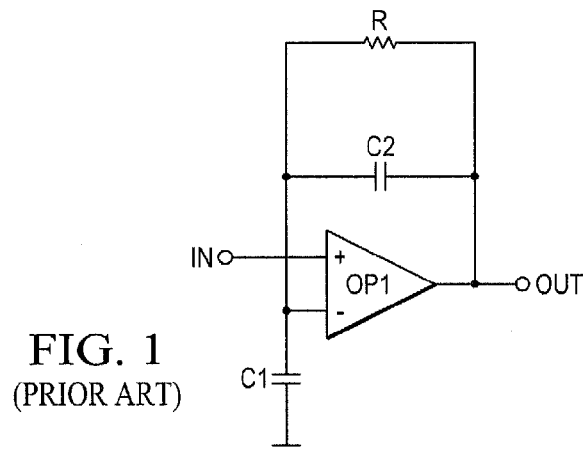
FIG. 1 shows a simplified circuit diagram of a capacitively fed back non inverting amplifier according to the prior art.
Figure 2:
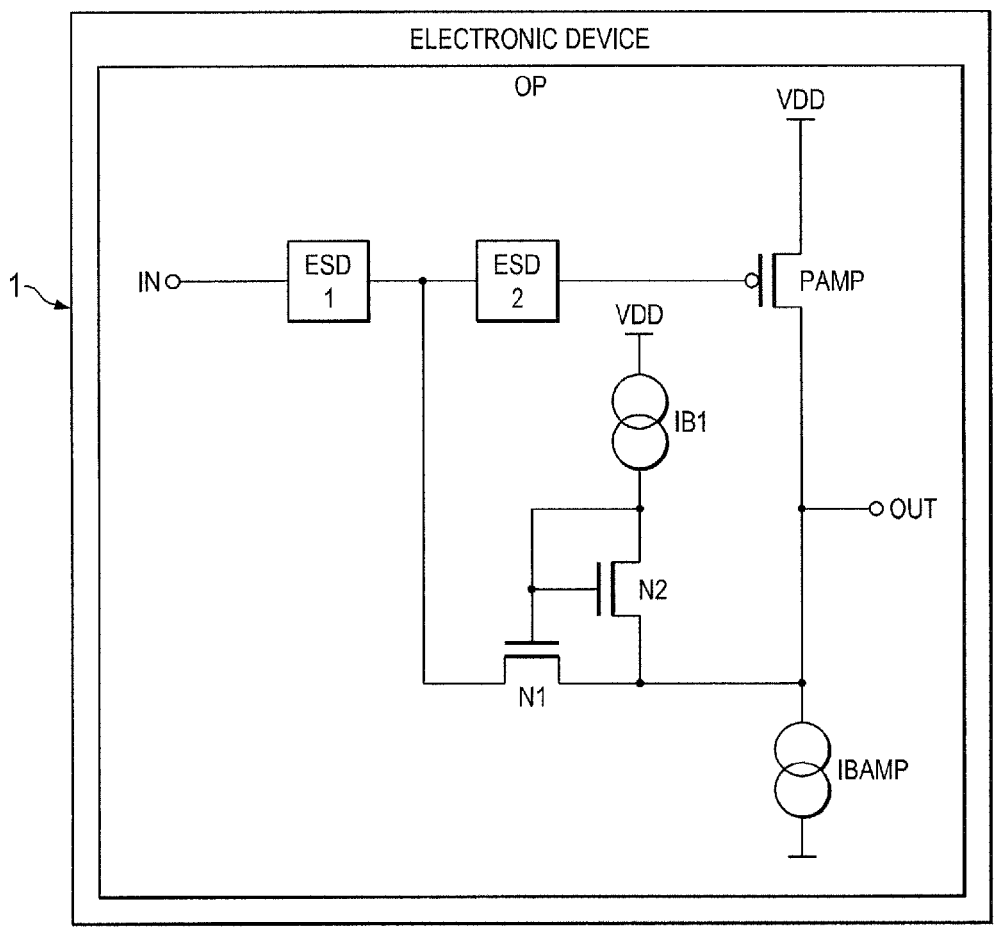
FIG. 2 shows a simplified circuit diagram of an electronic device according to an embodiment of the invention.

FIG. 2 shows a simplified circuit diagram of an embodiment of the invention. There is a single-transistor amplifier comprising a PMOS transistor PAMP and bias current source IBAMP coupled to supply a current through the PMOS transistor PAMP. The PMOS transistor serves as input transistor of the amplifier. The control gate of the input transistor PAMP is coupled to receive an input signal IN to be amplified. The transistor PAMP may have a transconductance (or slope) gm, which is defined by the properties (channel length and width of PAMP) and the bias current provided by IBMAP. There is a first transistor N1 which is coupled with its channel between the control gate of the input (or amplifying) transistor PAMP, i.e. the input IN of the amplifier and the output OUT of the amplifier. The control gate of the first transistor is biased with a second transistor N2, which is diode-coupled. Diode-coupled means that the gate and the drain of transistor N2 are coupled together. The source of N2 is also coupled to the output node. The control gate of the first transistor N1 is connected to the gate and the drain of the second transistor N2. In other words, the control gate of transistor N1 is coupled between the bias current source IB1 which feeds a bias current through diode-coupled transistor N2. The bias current supplied by IB1 is fed into the output node OUT. If this is not desired, as it may cause an offset at output OUT, a second bias current source may be coupled to the source of N2, which draws the bias current of IB1. Transistors N1 and N2 are NMOS transistor (i.e. they are of one doping type). The input transistor PAMP is a PMOS transistor (i.e. the input transistor is of a second doping type which is opposite to the doping type of transistor N1 and N2). Therefore, the supply voltage VDD can be as small as some of the minimum voltage drop required between source and gate of transistor PAMP and the minimum voltage drop along diode coupled transistor N2. The minimum gate-source voltage of transistor PAMP is one threshold level Vtp of a PMOS transistor. The minimum voltage drop across N2 is a threshold voltage level Vtn of an NMOS transistor. The supply voltage level VDD can therefore be as low as Vtp plus the minimum voltage for IBAMP (this may be another threshold voltage Vtn).

There may be optional ESD protection stages ESD1 or ESD2. ESD2 may occur if N1 and N2 are implemented as external components and the amplifier PAMP, IBAMP is an integrated circuit. ESD1 may occur if N1 and N2 are integrated with the amplifier.

Figure 3:
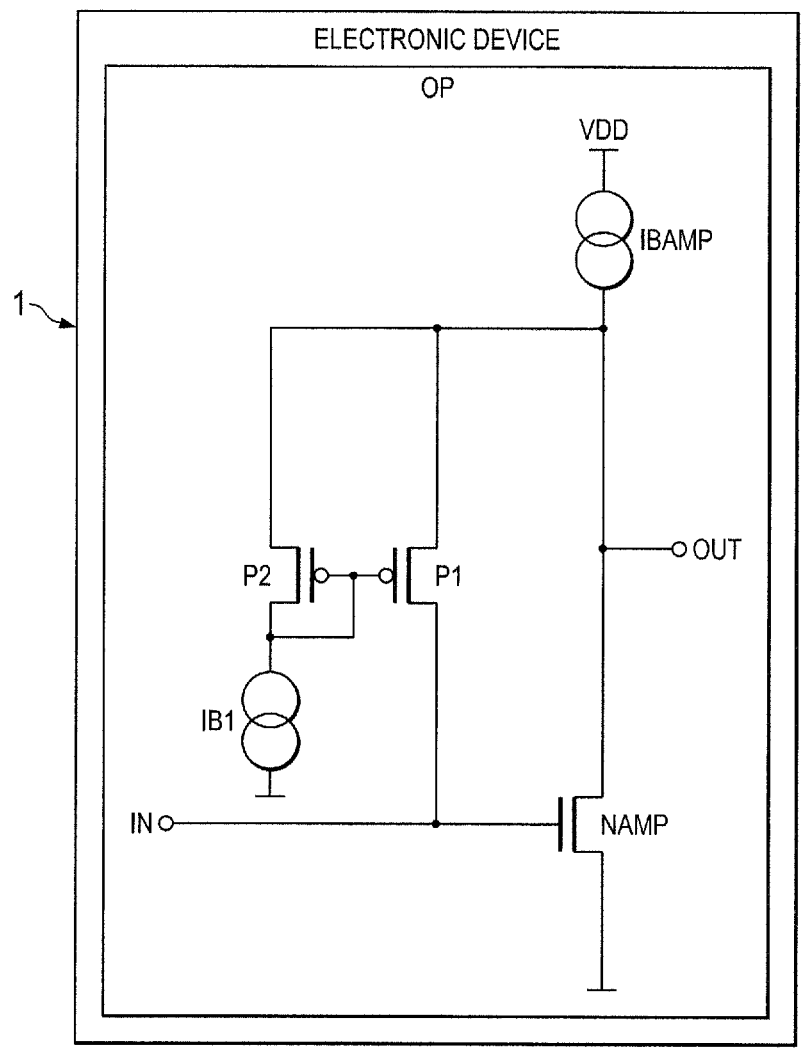
FIG. 3 shows a simplified circuit diagram of an electronic device according to another embodiment of the invention.

FIG. 3 shows a simplified circuit diagram of another embodiment of the invention. The transistor types of the amplifier and the feedback and biasing transistors are now opposite of the type of the circuit shown in FIG. 2. The input transistor of the amplifier NAMP is now an NMOS transistor. The feedback transistor (first transistor) P1 and the diode-coupled biasing transistor P2 are now PMOS transistors. The circuit has similar properties as those described with respect to FIG. 2. The first transistor P1 and the input transistor NAMP are of opposite types which allow very low supply voltage levels VDD to be used (similar to those explained with respect to FIG. 2).

Figure 4:
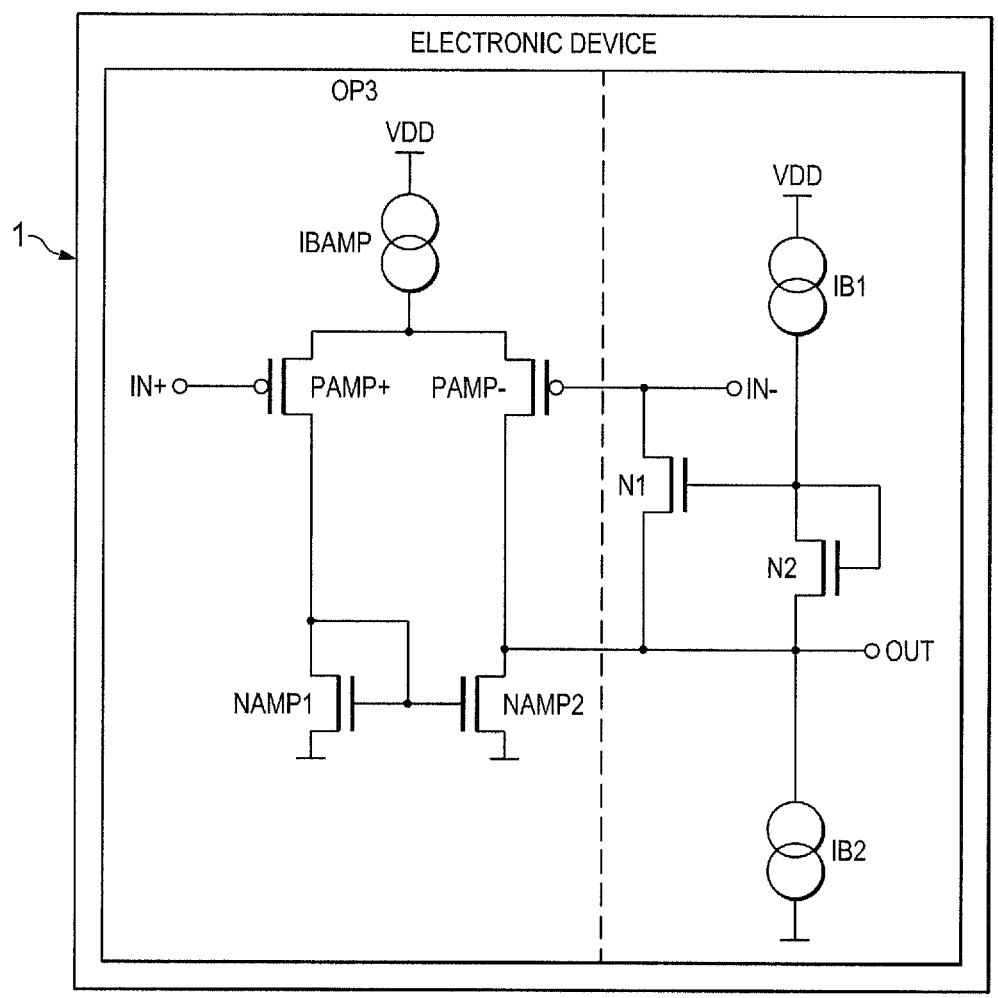
FIG. 4 shows a simplified circuit diagram of an electronic device according to another embodiment of the invention.

FIG. 4 shows an electronic device according to another embodiment of the invention. The electronic device 1 comprises an amplifier, which is now configured as a differential amplifier or operational amplifier OP3. The operational amplifier includes a differential stage of two PMOS transistors PAMP+ and PAMP−. Accordingly, there is an inverting input IN− at the control gate of PAMP− and a noninverting input IN+ at the control gate of the transistor PAMP+. The load for the differential stage is provided by a current mirror comprising transistors NAMP1 and NAMP2. The differential stage is biased by a current source IBAMP. There is a first transistor N1 coupled between the inverting input IN− of the differential amplifier and the output OUT of the differential amplifier. The control gate of the first transistor N1 is biased by a diode-coupled second transistor N2. As previously explained, the diode-coupled transistor N2 is biased by a first current source IB1. The control gate of transistor N1 is coupled between the first current source IB1 and the drain and gate of diode-coupled second transistor N2. The first transistor N1 and the second transistor N2 are NMOS transistors. The input transistors of the differential stage are PMOS transistors. In order to avoid a static offset caused by IB1 at the input of the amplifier, a second current source IB2, which compensates the current of IB1, can be coupled to the output node of the amplifier. This is useful for single stage amplifiers.

Figure 5:
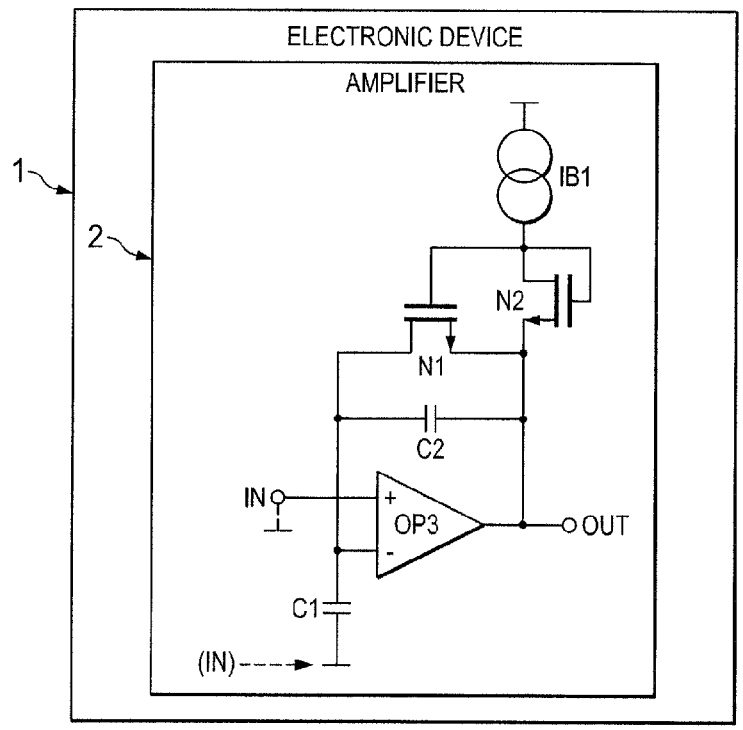
FIG. 5 shows a simplified circuit diagram of a capacitively fed back amplifier according to aspects of the invention.

FIG. 5 shows a simplified circuit diagram of an embodiment of the invention. There is an electronic device 1 comprising an operational amplifier OP3 with a capacitive feedback connection. The operational amplifier OP3 may be implemented as shown in FIG. 4. The first transistor N1 and the second transistor N2 are now externally coupled to the operational amplifier OP3. The amplifier 2 is now configured as a noninverting or inverting amplifier. The amplifier 2 comprises the operational amplifier OP3, capacitors C1 and C2 and transistors N1 and N2 as well as bias current sources IB1 and IB2. The inverting input of the operational amplifier OP3 is coupled to a first side of a capacitor C2. The second side of the capacitor C2 is coupled to the output OUT of the operational amplifier OP3. An input signal IN is fed into the noninverting input of the operational amplifier OP3. A capacitor C1 is coupled with one side to the inverting input of operational amplifier OP3 and with the other side to ground. There is a MOS transistor N1 which is coupled with one side of its channel (either drain or source) to the inverting input of the operational amplifier OP3 and with the other side (either source or drain) of the channel to the output OUT of the operational amplifier. There is a first current source IB1 and a diode-coupled MOS transistor N2. The diode-coupled MOS transistor N2 is coupled between the first current source and the output OUT of the operational amplifier. This configuration of the diode-coupled transistor (in this embodiment NMOS transistor) serves to properly bias the transistor N2. "Diode-coupled" means that the gate of the transistor N2 is coupled to drain of transistor N2. A gate of the first transistor N1 is coupled to the drain and the gate of transistor N2 (i.e. between the first current source IB1 and the diode-coupled transistor N2 second). The other side (i.e. the source) the source of the diode-coupled transistor N2 is coupled to the output OUT of the operational amplifier OP3.

In this embodiment, the capacitively fed back operational amplifier OP3 is biased properly. The current IB1 through transistor N2 is fed into the output OUT and operational amplifier OP3 and may, dependent of the configuration of the operational amplifier OP3, then be neglected with respect to the voltage at the output node OUT. This provides the proper offset for the gate source voltage of N2, independently of the input voltage. The biasing principle for the capacitively fed back amplifier is related to the output voltage OUT of the amplifying stage instead of being bound by the input voltage range. The transistor N1 and the feedback path therefore remain in a well biased range instead of losing the DC operating point.

Figure 6:
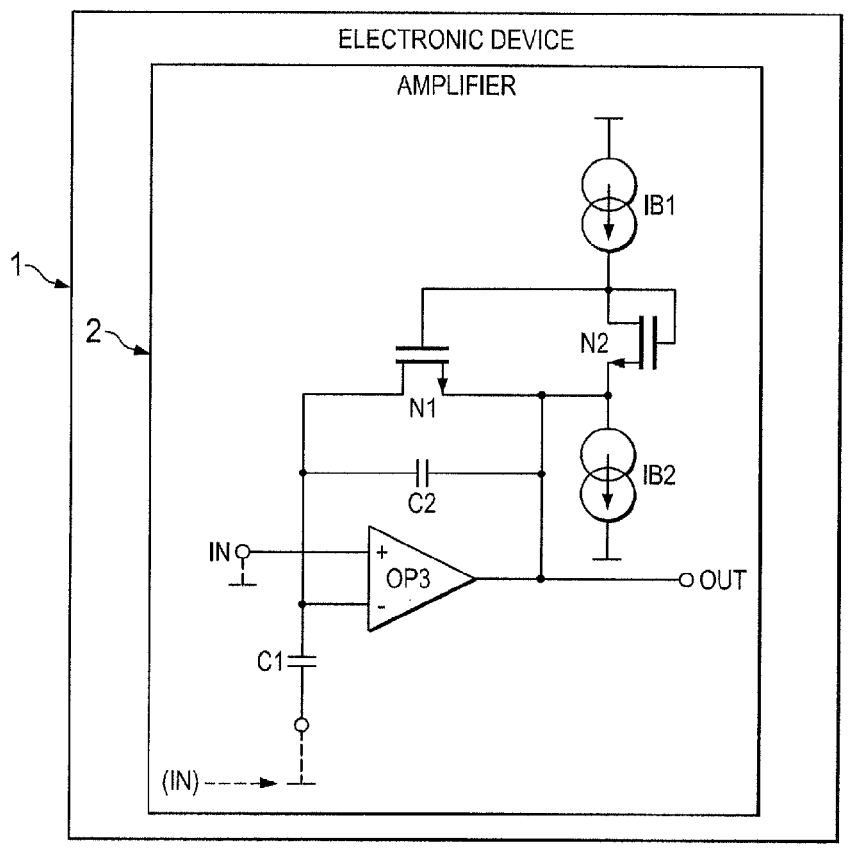
FIG. 6 shows a simplified circuit diagram of a capacitively fed back amplifier according to aspects of the invention.

FIG. 6 shows a simplified circuit diagram of another embodiment of the invention. There is an electronic device comprising a capacitively fed back operational amplifier OP3. The operational amplifier OP3 may be implemented as shown in FIG. 4. The operational amplifier may be configured as a noninverting amplifier or an inverting amplifier. The configuration for the inverting amplifier is indicated with dashed lines. The amplifier 2 is similar to the configuration shown in FIG. 5. The amplifier 2 comprises the operational amplifier OP3, capacitors C1 and C2 and transistors N1 and N2 as well as bias current source IB1. However, in addition to the circuit shown in FIG. 5, there is a second current source IB2. Though the current sources IB1 and IB2 are supposed to be equal. Accordingly, IB1 should be equal to IB2. The transistor N1 and the feedback path is now biased with the diode-coupled transistor N2 that is coupled with both sides to the current source IB1 and the current source IB2, respectively. Accordingly, the current that might be fed to the output node OUT of the operational amplifier OP2 is minimized to the mismatch between current IB1 and IB2.

The embodiments shown in FIG. 5 and FIG. 6 are optimized with respect to the following aspect of the invention. The lower corner frequency of the amplifier 2 is $$fc = 2 \cdot \pi \cdot R \cdot C2 \quad (1)$$

where R is either the resistor in the feedback path of the operational amplifier OP3, or R is the on-resistance of a transistor in the feedback path, if, for example a transistor N1 is used instead of a resistor R. The resistor R in the feedback path has a parasitic capacitance CPAR. The embodiments of the invention are favorable, if CPAR is greater than C2. The parasitic capacitance CPAR of a resistor used in the feedback path would then dominate the capacitance C2 in the feedback path. This can be prevented with a transistor N1 as shown in the embodiments of the invention. As long as CPAR is much smaller than C2 (CPAR<<C2), a resistor R may be used in the feedback path instead of transistor N1. According to an aspect of the invention, a design procedure of an electronic device 1 may then include the following steps. A capacitively fed back amplifier may be designed for a certain lower corner frequency fc. A parasitic capacitance CPAR of a resistor for the corner frequency fc is determined. If the parasitic capacitor CPAR is equal to or greater than the capacitor C2 in the feedback path, a transistor N1 is coupled in parallel to the capacitor C2 in the feedback path. The transistor N1 is then biased as shown in the embodiments of the invention. Accordingly, a diode coupled transistor N2 is coupled with one side to a gate of the transistor N1 to the feedback path and with the other side to a current source IB2, or to the output of the operational amplifier OP3. The other side that is coupled to the gate of the other side of the diode coupled transistor N2 that is coupled to the gate of transistor N1 is coupled to the current source IB1. The electronic device that is designed according to these aspects is then manufactured.

Figure 7:
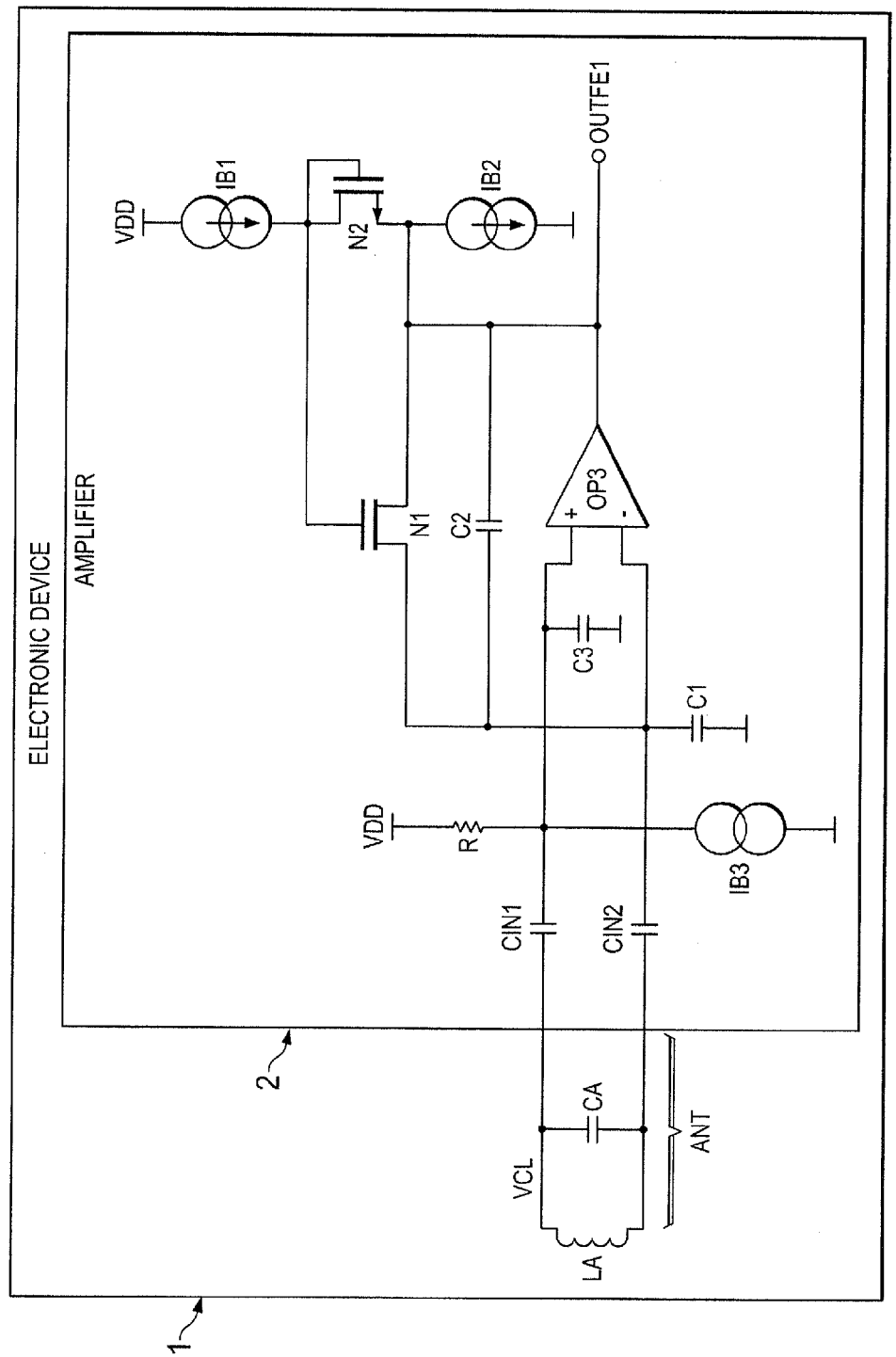
FIG. 7 shows a simplified circuit diagram of an embodiment of the invention.

FIG. 7 shows a simplified circuit diagram of an embodiment of the invention. FIG. 7 shows how an amplifier 2, according to the invention, may be used. This embodiment relates to an RFID (Radio Frequency Identification) application. The amplifier N2 may then be used for the frontend of an integrated RFID-chip. There is an antenna ANT comprising an inductor LA and a capacitor CA. The antenna ANT oscillates in accordance with the received radio frequency signal. This signal is fed into operational amplifier OP3 through capacitors CIN1 and CIN2. A bias current source IB3 may be coupled to the noninverting input of the operational amplifier OP3. Furthermore, a resistor or source follower (the drain of which is coupled to VDD, the gate receives a bias voltage and the source is coupled to the noninverting input) may be coupled between the noninverting input and supply voltage. This serves to properly bias the noninverting input. The operational amplifier OP3 is configured as shown in FIG. 4. There is a capacitor C2 coupled between the output OUTFI1 of the operational amplifier OP3 and the inverting input of the operational amplifier OP3. There is a capacitor C1 coupled between the inverting input of operational amplifier OP3 and ground. There is another capacitor C3 coupled between the noninverting input of OP3 and ground. There is a transistor N1 coupled in parallel to capacitor C2. This means that one side of the channel (drain or source) of the transistor N1 is coupled to the output node OUTFI1 of the operational amplifier OP3 and another side of the channel of the transistor N1 (either drain or source) is coupled to the other side of capacitor C2 and the inverting input of operational amplifier OP3. The gate of transistor N1 is coupled to the drain of transistor N2. The gate of transistor N2 is also coupled to the drain of transistor N2 and the gate of transistor N1. There is a current source IB1 that is coupled to the drain and the gate of transistor N2 for supplying a bias current through a diode coupled transistor N2. There is another current source IB2 that is coupled to the source of diode-coupled transistor N2 and the one side of the channel of transistor N1 as well as one side of capacitor C2. Current source IB2 is coupled to output node OUTFE1 of operational amplifier OP3. The output signal OUTFE1 of this first stage of an amplifier may be coupled to a second stage, as the one shown in FIG. 4. The circuit shown

The invention claimed is:

1. An electronic device comprising:
an amplifier having at least a first input transistor of a first doping type;
a first transistor coupled with a channel as a feedback path between an output of the amplifier and a control gate of the first input transistor forming an input of the amplifier;
a diode-coupled second transistor being coupled with a channel between a first current source and the output of the amplifier;
wherein a control gate of the first transistor is coupled between the first current source and the diode-coupled second transistor; and
wherein the first transistor is of a second doping type which is opposite to the first doping type of the first input transistor of the amplifier.

2. The electronic device according to claim 1, wherein the amplifier has a differential stage comprising the first input transistor providing an inverting input and a second input transistor of the first doping type providing a noninverting input.

3. The electronic device according to claim 1, wherein the amplifier is an operational amplifier.

4. The electronic device according to claim 1, comprising a capacitor coupled in parallel to the channel of the first transistor between the control gate of the first transistor and the output of the amplifier.

5. The electronic device according to claim 1, further comprising a second capacitor coupled with one side to the control gate of the first input transistor.

6. The electronic device according to claim 1, further comprising a second current source which is coupled between the output of the amplifier and ground.

7. The electronic device according to claim 1, wherein the diode-coupled second transistor is of the second doping type.

8. A method of biasing an amplifier having a at least a first input transistor of a first doping type and a first transistor of a second doping type opposite to the first doping type which is coupled in a feedback path of the amplifier, the method comprising:
biasing the control gate of the first transistor in the feedback path with a diode-coupled transistor that is coupled at one side to a first current source and to a control gate of the first transistor and at the other side to an output of the amplifier.

9. The method of claim 8, wherein the amplifier is an operational amplifier.

10. An RFID device comprising:
an antenna comprising an inductor and a capacitor for receiving an RFID signal;
an amplifier for amplifying the received RFID signal comprising:
an electronic device comprising:
an amplifier having at least a first input transistor of a first doping type;
a first transistor coupled with a channel as a feedback path between an output of the amplifier and a control gate of the first input transistor forming an input of the amplifier;
a diode-coupled second transistor being coupled with a channel between a first current source and the output of the amplifier;
wherein a control gate of the first transistor is coupled between the first current source and the diode-coupled second transistor; and
wherein the first transistor is of a second doping type which is opposite to the first doping type of the first input transistor of the amplifier.

11. The electronic device according to claim 10, wherein the amplifier has a differential stage comprising the first input transistor providing an inverting input and a second input transistor of the first doping type providing a noninverting input.

12. The electronic device according to claim 10, wherein the amplifier is an operational amplifier.

13. The electronic device according to claim 10, comprising a capacitor coupled in parallel to the channel of the first transistor between the control gate of the first transistor and the output of the amplifier.

14. The electronic device according to claim 10, further comprising a second capacitor coupled with one side to the control gate of the first input transistor.

15. The electronic device according to claim 10, further comprising a second current source which is coupled between the output of the amplifier and ground.

16. The electronic device according to claim 10, wherein the diode-coupled second transistor is of the second doping type.

17. The electronic device according to claim 3, comprising a capacitor coupled in parallel to the channel of the first transistor between the control gate of the first transistor and the output of the amplifier.

18. The electronic device according to claim 4, further comprising a second capacitor coupled with one side to the control gate of the first input transistor.

19. The electronic device according to claim 18, further comprising a second current source which is coupled between the output of the amplifier and ground.

20. The electronic device according to claim 19, wherein the diode-coupled second transistor is of the second doping type.

* * * * *